United States Patent
Jenq et al.

(10) Patent No.: US 12,538,805 B2
(45) Date of Patent: Jan. 27, 2026

(54) SEMICONDUCTOR PACKAGE AND METHOD OF MANUFACTURING THE SAME

(71) Applicant: CHIPBOND TECHNOLOGY CORPORATION, Hsinchu (TW)

(72) Inventors: Shrane-Ning Jenq, Hsinchu County (TW); Chen-Yu Wang, Hsinchu (TW); Chin-Tang Hsieh, Kaohsiung (TW); Shu-Yeh Chang, Hsinchu (TW); Lung-Hua Ho, Hsinchu (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 438 days.

(21) Appl. No.: 17/988,846

(22) Filed: Nov. 17, 2022

(65) Prior Publication Data
US 2023/0187378 A1   Jun. 15, 2023

(30) Foreign Application Priority Data

Dec. 14, 2021   (TW) ................. 110146832

(51) Int. Cl.
*H01L 23/552*   (2006.01)
*H01L 21/56*   (2006.01)
(Continued)

(52) U.S. Cl.
CPC .......... *H01L 23/552* (2013.01); *H01L 21/561* (2013.01); *H01L 23/3121* (2013.01); *H01L 23/49811* (2013.01)

(58) Field of Classification Search
CPC .................. H01L 23/552; H01L 25/0655
See application file for complete search history.

(56) References Cited

U.S. PATENT DOCUMENTS

2009/0212401 A1*   8/2009   Do .................. H01L 24/73
                                                257/659
2009/0236700 A1    9/2009   Moriya
(Continued)

FOREIGN PATENT DOCUMENTS

CN        103582946 A    2/2014
JP      2000-200859 A    7/2000
(Continued)

OTHER PUBLICATIONS

Japanese Office Action mailed Dec. 13, 2023 for Japanese Patent Application No. 2022-184615, 2 pages.
(Continued)

*Primary Examiner* — Michele Fan
(74) *Attorney, Agent, or Firm* — Demian K. Jackson; Jackson IPG PLLC

(57) ABSTRACT

In a method of manufacturing a semiconductor package, at least one conductive wire is formed on a substrate in a wire bonding process, a ball end of the conductive wire is located above the substrate, a molding material is provided to cover the conductive wire except the ball end, and an EMI shielding layer is formed on the molding material to connect to the ball end. Owing to the ball end is exposed on the molding material, connection area of the EMI shielding layer to the conductive wire is increased to improve connection strength and reliability between the EMI shielding layer and the conductive wire.

8 Claims, 6 Drawing Sheets

(51) Int. Cl.
    *H01L 23/31*         (2006.01)
    *H01L 23/498*      (2006.01)

(56) References Cited

U.S. PATENT DOCUMENTS

| | | | |
|---|---|---|---|
| 2012/0061816 A1* | 3/2012 | Song | H01L 23/3677 |
| | | | 257/E23.079 |
| 2012/0280386 A1 | 11/2012 | Sato et al. | |
| 2017/0309575 A1 | 10/2017 | Lee | |
| 2018/0040569 A1 | 2/2018 | Lee | |
| 2018/0098418 A1* | 4/2018 | Lee | H05K 1/111 |
| 2018/0374798 A1 | 12/2018 | Lee et al. | |
| 2019/0206827 A1* | 7/2019 | Eskandar | H01L 25/0655 |

FOREIGN PATENT DOCUMENTS

| | | | |
|---|---|---|---|
| JP | 2007-123595 A | 5/2007 | |
| JP | 2010-010441 A | 1/2010 | |
| JP | 2014-103252 A | 6/2014 | |
| JP | 2017-038074 A | 2/2017 | |
| WO | 2008/093414 A1 | 8/2008 | |
| WO | 2018/164158 A1 | 9/2018 | |

OTHER PUBLICATIONS

Taiwanese Office Action mailed May 17, 2022 for Taiwanese Patent Application No. 110146832, 6 pages.
Japanese notice of allowance mailed Sep. 12, 2024 for Japanese patent application No. 2022-184615, 3 pages.
Chinese office action mailed Jul. 7, 2025 for Chinese patent application No. 202111590119.5, 11 pages.

\* cited by examiner

SEMICONDUCTOR PACKAGE AND METHOD OF MANUFACTURING THE SAME

FIELD OF THE INVENTION

This invention relates to a semiconductor package and a method of manufacturing the same, and more particularly to a semiconductor package and a method of manufacturing the same with improved connection strength and reliability between an EMI (electromagnetic interference) shielding layer and conductive wires.

BACKGROUND OF THE INVENTION

Conventional semiconductor package becomes smaller in size gradually so it may be interfered by electromagnetic wave to cause performance reduction or damage of device, equipment or system having the semiconductor package.

Generally, a frame is provided on a carrier and a protection lid is provided on the frame to protect the semiconductor package from EMI. However, the frame has to be reduced in size while the carrier is designed to be smaller, that may increase difficulty of frame manufacture and alignment of the frame to the carrier and reduce connection strength and reliability between the frame and the carrier.

SUMMARY

One object of the present invention is to provide a semiconductor package and a method of manufacturing the same. By increasing connection area of an EMI shielding layer to a conductive wire, connection strength and reliability between the EMI shielding layer and the conductive wire can be enhanced to overcome the issue of misalignment of the frame to the carrier in the prior art.

A semiconductor package of the present invention includes a substrate including a ground pad, a semiconductor component, a conductive wire, a molding material and an EMI shielding layer. The semiconductor component is mounted on and electrically connected to the substrate. The conductive wire is formed on the substrate by a wire bonding process and includes a wire body, a conduction end located on one end of the wire body and a ball end located on the other end of the wire body, an outer diameter of the ball end is greater than an outer diameter of the wire body, the conduction end is bonded to the ground pad, and the ball end is located above the substrate. The molding material is provided on the substrate to cover the semiconductor component, the wire body and the conduction end, the ball end is visible from the molding material. The EMI shielding layer is formed on the molding material and connected to the ball end.

A method of manufacturing a semiconductor package includes the steps of: providing a carrier including a plurality of substrates connected with each other, each of the substrates includes at least one ground pad; providing a plurality of semiconductor components which each is mounted on and electrically connected to one of the substrates; performing a wire bonding process, at least one conductive wire is formed on each of the substrates, the conductive wire includes a wire body, a conduction end located on one end of the wire body and a ball end located on the other end of the wire body, an outer diameter of the ball end is greater than an outer diameter of the wire body, the conduction end is bonded to the ground pad, and the ball end is located above the substrate; performing a molding process, a plurality of molding materials are provided on the carrier, each of the molding materials covers one of the semiconductor components, the wire body and the conduction end, and expose the ball end of the conductive wire on one of the substrates; and forming an EMI shielding layer on each of the molding materials, the EMI shielding layer is connected to the ball end.

In the present invention, the ball end is designed to have a greater outer diameter than that of the wire body or is designed to have an exposed surface larger than the sectional area of the conductive wire, thereby increasing connection area of the EMI shielding layer to the conductive wire and improving connection strength and reliability between the EMI shielding layer and the conductive wire.

DETAILED DESCRIPTION OF THE INVENTION

A semiconductor package 100 of the present invention is manufactured by a method as shown in FIGS. 1 to 9. The method includes a step S1 of providing a carrier, a step S2 of providing semiconductor components, a step S3 of wire bonding process, a step S4 of molding process and a step S6 of forming EMI shielding layer. In this embodiment, the method of manufacturing the semiconductor package 100 further includes a step S5 of removing process before the step S6.

Figure 1:
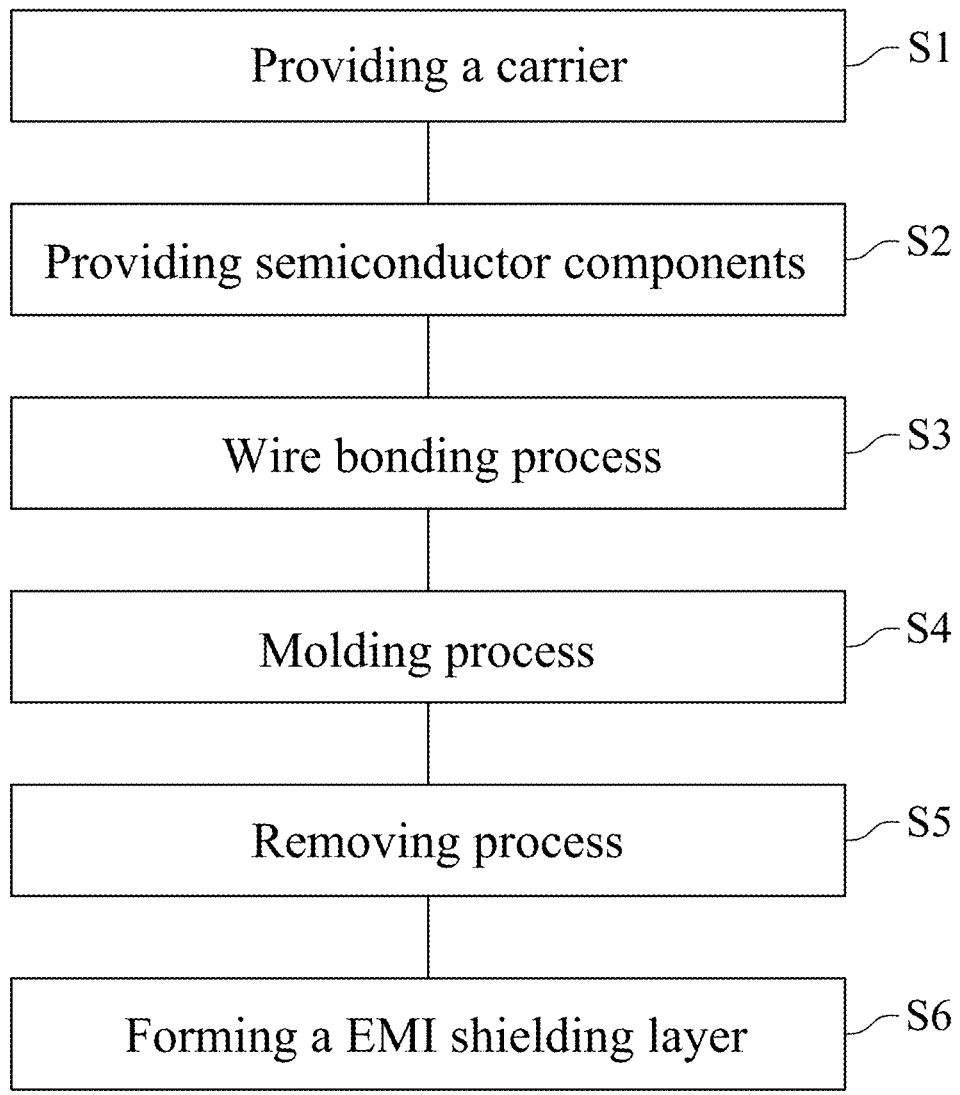
FIG. 1 is a flowchart illustrating a method of manufacturing a semiconductor package in accordance with one embodiment of the present invention.
Figure 2:
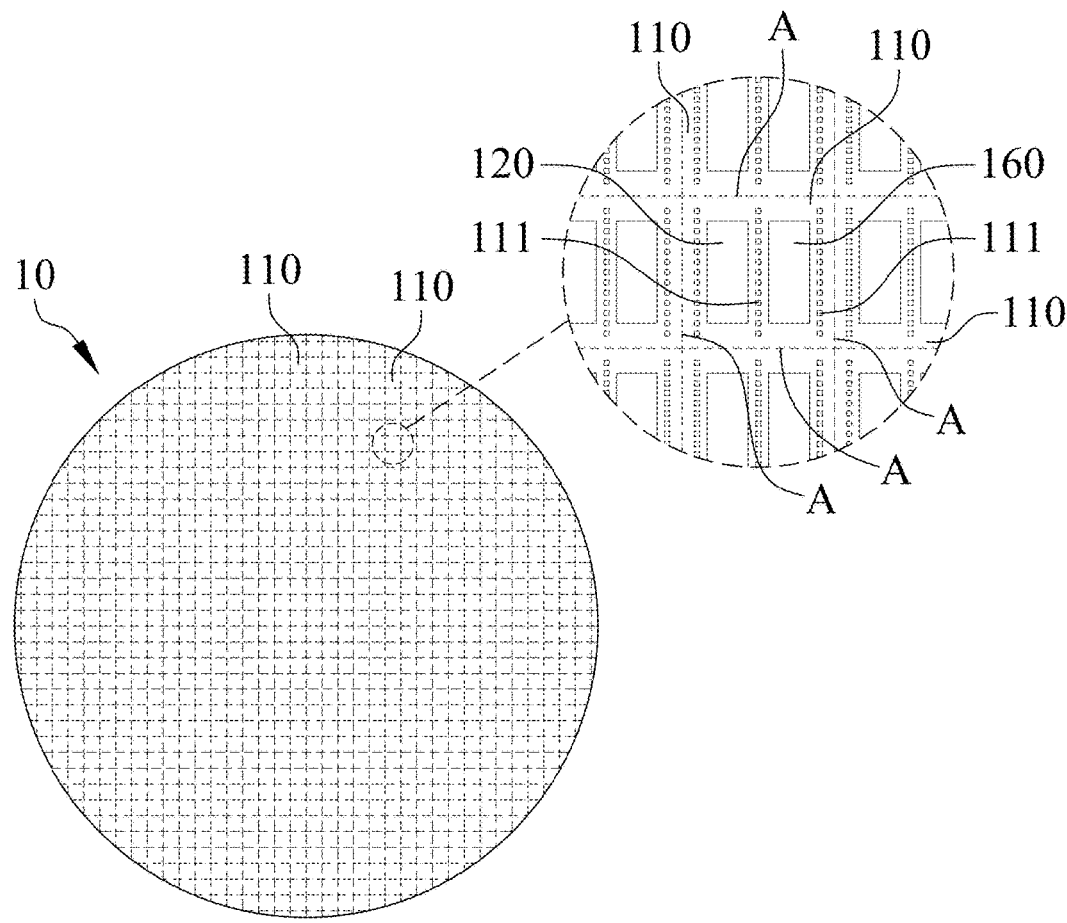
FIG. 2 is a top view diagram illustrating a carrier of a semiconductor package in accordance with one embodiment of the present invention.
Figure 3:
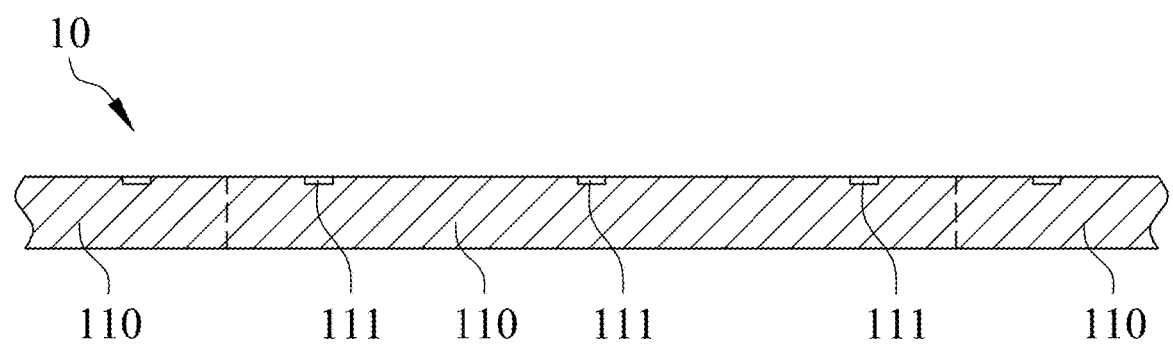
FIGS. 3 to 9 are cross-section view diagrams illustrating a method of manufacturing a semiconductor package in accordance with one embodiment of the present invention.

With reference to FIGS. 1 to 3, a carrier 10 is provided in the step S1 and it includes a plurality of substrates 110 which are connected with each other, each of the substrates 110 includes at least one ground pad 111. The carrier 10 may be a wafer or a circuit board. In this embodiment, the carrier 10 is a wafer and each of the substrates 110 includes at least one wire (not shown) which is a redistribution layer (RDL).

Figure 4:
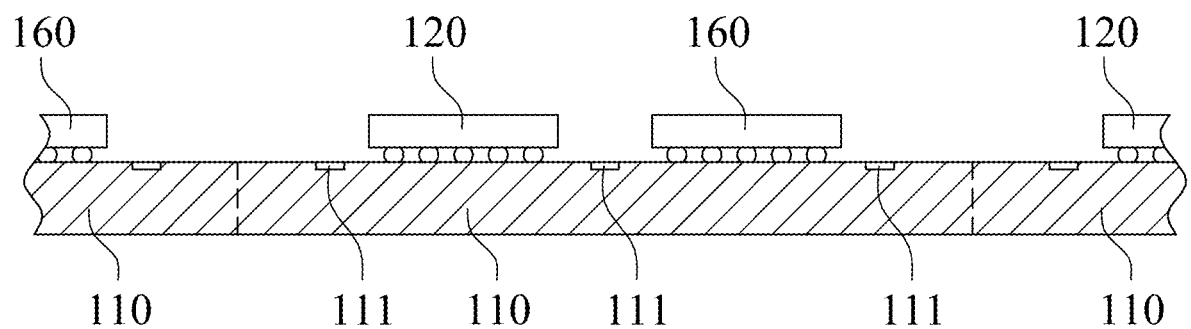

With reference to FIGS. 1, 2 and 4, a plurality of semiconductor components 120 are provided in the step S2 and each of them is mounted on one of the substrates 110. Each of the semiconductor components 120 may be a chip electrically connected to the substrate 110. In this embodiment, a plurality of electronic components 160 are further provided in the step S2. Each of the electronic components 160 is mounted on and electrically connected to one of the substrates 110, and it may be another chip, an active electronic component or a passive electronic component.

Figure 5:
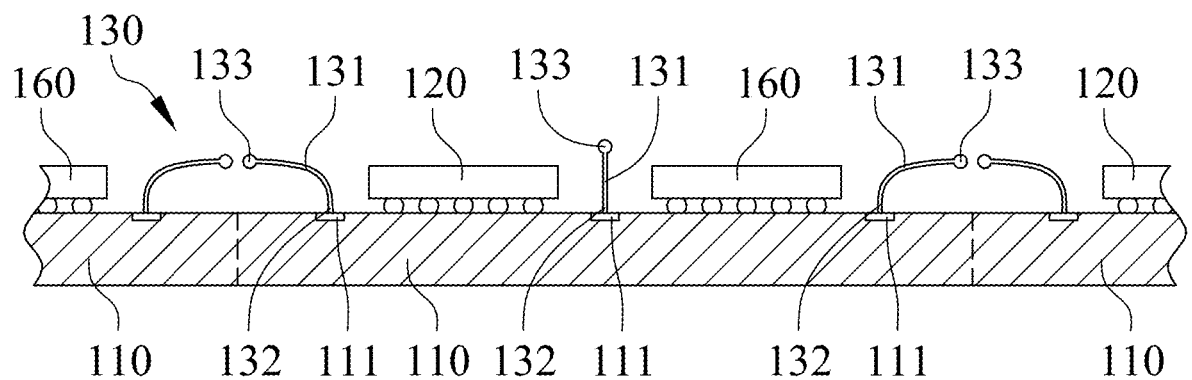

With reference to FIGS. 1 and 5, a wire bonding process is performed in the step S3, at least one conductive wire 130, which may be made of gold or copper, is formed on each of the substrates 110.

Figure 10:
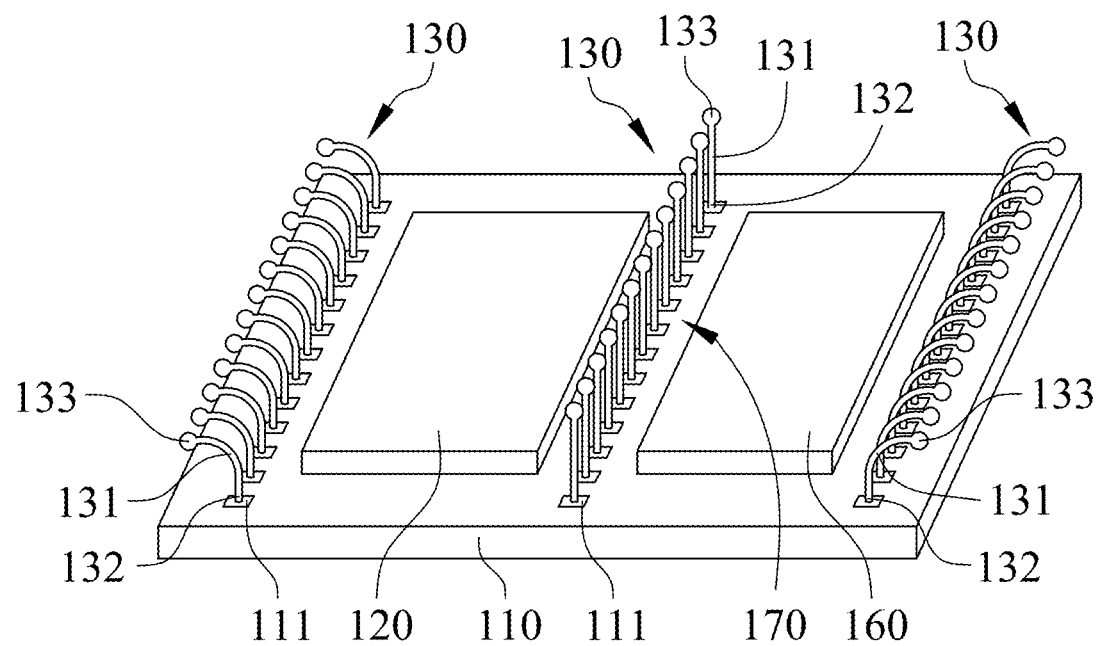
FIG. 10 is a perspective diagram illustrating conductive wires arrangement on a substrate of a semiconductor package in accordance with one embodiment of the present invention.

With reference to FIGS. 5 and 10, the conductive wire 130 includes a wire body 131, a conduction end 132 located on one side of the wire body 131 and a ball end 133 located on the other side of the wire body 132, the ball end 133 has an outer diameter greater than that of the wire body 131. The conduction end 132 is bonded to the ground pad 111, the wire body 131 is extended upwardly or laterally from the substrate 110 such that the ball end 133 is located above the substrate 110. In this embodiment, the conduction end 132 is bonded to the ground pad 111 by a bonding tool (not shown), such as capillary, and the ball end 133 is formed on the free end of the wire body 131 through EFO (electronic flame off). Preferably, the ratio of the outer diameter of the wire body 131 to the outer diameter of the ball end 133 is greater than or equal to 1:1.1 and is less than or equal to 1:3.

Figure 11:
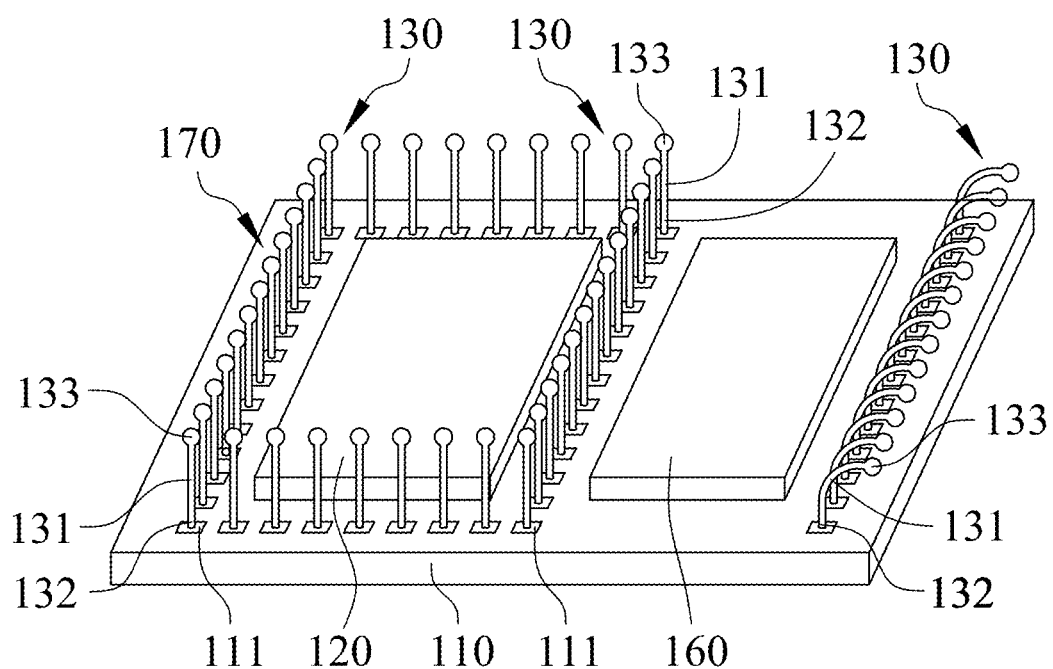
FIG. 11 is a perspective diagram illustrating conductive wires arrangement on a substrate of a semiconductor package in accordance with another embodiment of the present invention.

With reference to FIGS. 5 and 10, preferably, a plurality of conductive wires 130 are formed on each of the substrates 110 in the step S3 and they construct an EMI shielding fence 170. In this embodiment, the conductive wires 130 used to construct the EMI shielding fence 170 are extended upwardly from each of the substrates 110, and the EMI shielding fence 170 is located between the semiconductor component 120 and the electronic component 160 to separate and shield them so as to reduce the mutual interference between the semiconductor component 120 and the electronic component 160 on the same substrate 110. In another embodiment as shown in FIG. 11, the semiconductor component 120 is surrounded by the EMI shielding fence 170.

Figure 6A:
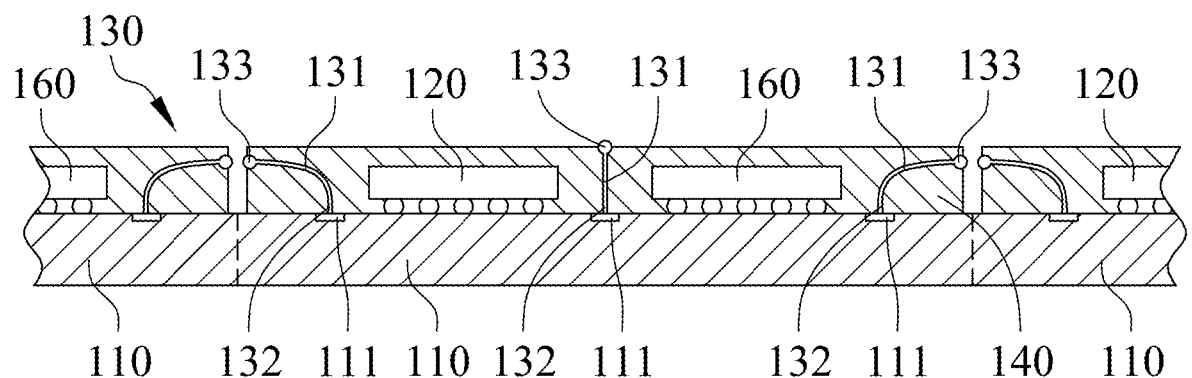
Figure 6B:
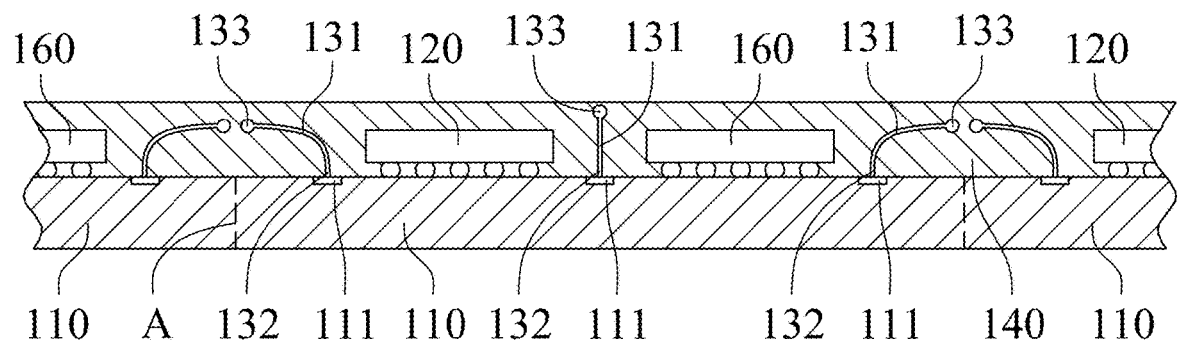

With reference to FIGS. 1 and 6A, a plurality of molding materials 140 are provided on the carrier 10 in the step S4, each of the molding materials 140 covers the semiconductor component 120, the electronic component 160, the wire body 131 and the conduction end 132, but not cover the ball end 133.

If the ball end 133 of each of the conductive wires 130 is visible from the molding material 140 (as shown in FIG. 6A) after the step S4, then the step S6 can be proceeded.

However, if the ball end 133 of each of the conductive wires 130 is covered by the molding material 140 after the step S4, the step S5 has to be proceeded after the step S4 to remove a part of the molding material 140 to allow the ball end 133 of each of the conductive wires 130 to be exposed on the molding material 140, and then the step S6 is proceeded after the step S5.

Figure 7:
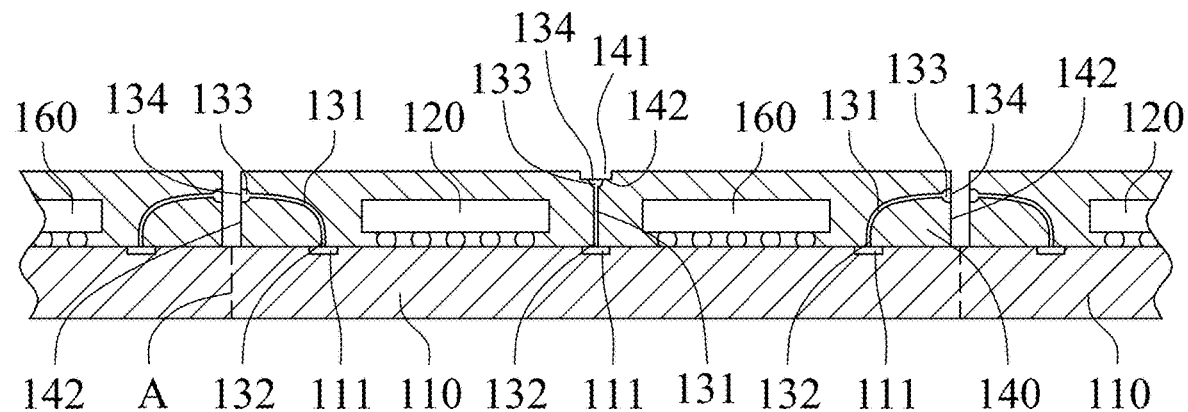

With reference to FIGS. 1 and 7, while the wire body 131 of each of the conductive wires 130 is extended upwardly from the substrate 110, each of the molding materials 140 can be thinned by laser or grinding in the step S5 to expose the ball end 133 of each of the conductive wires 130, or a notch 141 can be formed on each of the molding materials 140 by laser or grinding in the step S5 to expose the ball end 133 of each of the conductive wires 130.

With reference to FIGS. 2 and 7, as the wire body 131 of each of the conductive wires 130 is extended laterally from the substrate 110, each of the molding materials 140 can be cut along a cutting path A in the step S5 to expose the ball end 133 of each of the conductive wires 130 on lateral side of the molding material 140.

As shown in FIG. 7, after the step S5, the ball end 133 of each of the conductive wires 130 is visible from the molding material 140 by thinning the molding material 140, forming the notch 141 or cutting the molding material 140. The ball end 133 has an exposed surface 134 which is exposed on a surface 142 of the molding material 140, the exposed surface 134 of the ball end 133 and the surface 142 of the molding material 140 are coplanar, and the exposed surface 134 has an area greater than a sectional area of the wire body 131.

With reference to FIG. 7, when each of the molding materials 140 is processed to form the notch 141 in the step S5, the surface 142 of the molding material 140 is referred to an inner surface of the notch 141 herein, and the exposed surface 134 of the ball end 133 and the inner surface of the notch 141 are coplanar. When the molding material 140 is cut to expose the ball end 133 on lateral side, the surface 142 of the molding material 140 is referred to a lateral surface of the molding material 140 herein, and the exposed surface 134 of the ball end 133 and the lateral surface of the molding material 140 are coplanar.

Figure 8:
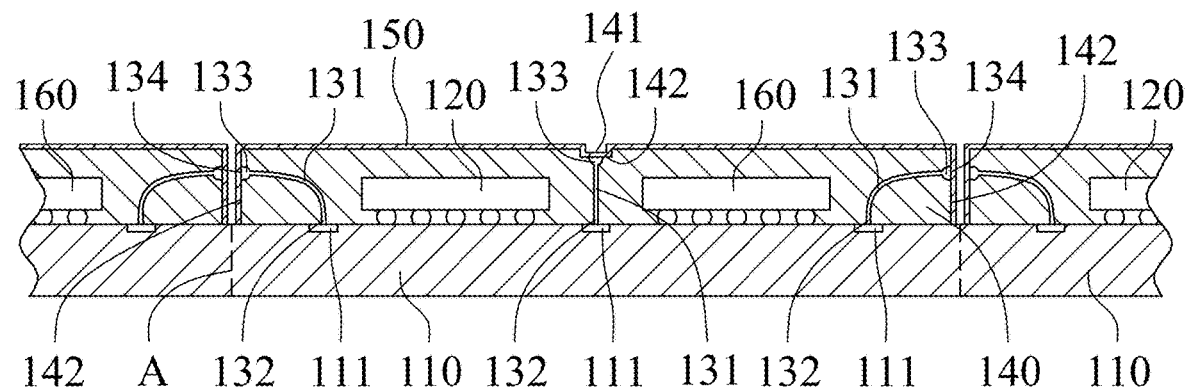

With reference to FIGS. 1 and 8, an EMI shielding layer 150 is formed on each of the molding materials 140 in the step S6. The EMI shielding layer 150 is made of conductive material such as copper (Cu), iron (Fe), cobalt (Co), nickel (Ni) or stainless steel, and it can be disposed on the molding material 140 by metal film adhesion, electroplating, sputtering or coating. Preferably, the EMI shielding layer 150 covers the molding material 140 and is connected to the ball end 133. In this embodiment, the EMI shielding layer 150 is bonded to the exposed surface 134 of the ball end 133.

Figure 9:
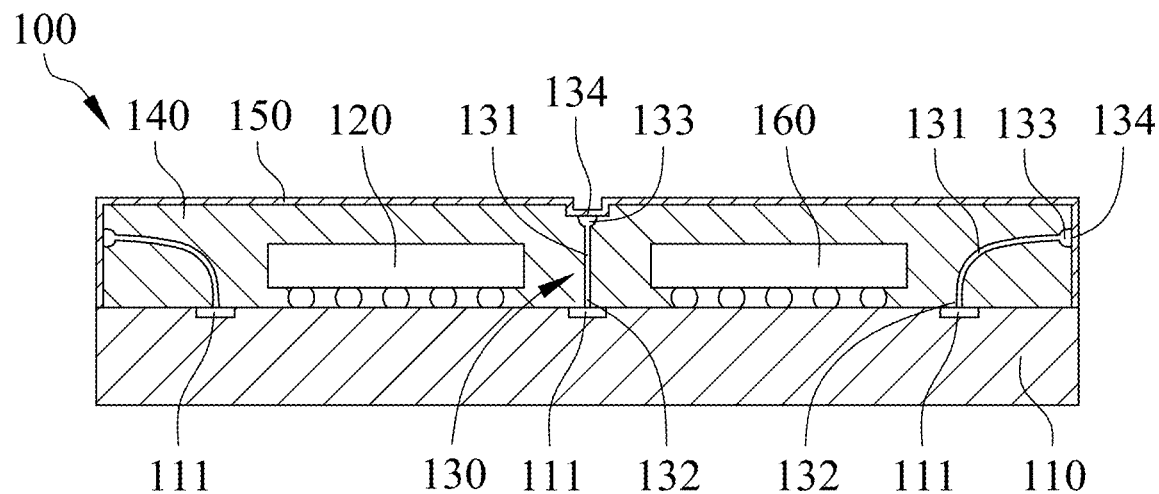

With reference to FIG. 9, the carrier 10 can be cut to separate the substrates 110 after the step S6 so as to obtain a plurality of semiconductor packages 100.

In the present invention, the connection area of the EMI shielding layer 150 to the conductive wire 130 is increased owing to the ball end 133 is designed to have an outer diameter greater than that of the wire body 131 or the exposed surface 134 of the ball end 133 is designed to be greater than the sectional area of the wire body 131. Accordingly, the connection strength and reliability between the EMI shielding layer 150 and the conductive wire 130 can be improved.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A semiconductor package comprising:
   a substrate including at least one ground pad;
   a semiconductor component mounted on and electrically connected to the substrate;
   at least one conductive wire formed on the substrate by a wire bonding process, the at least one conductive wire includes a wire body, a conduction end located on one side of the wire body and a ball end located on the other side of the wire body, an outer diameter of the ball end is greater than an outer diameter of the wire body, the wire body is extended upwardly from the substrate, the conduction end is bonded to the at least one ground pad, and the ball end is located above the substrate;
   a molding material provided on the substrate and configured to cover the semiconductor component, the wire body and the conduction end, wherein there is a notch on the molding material, the ball end is visible from the notch and has an exposed surface which is coplanar to an inner surface of the notch; and
   an EMI shielding layer formed on the molding material and connected to the ball end.

2. The semiconductor package in accordance with claim 1 further comprising an electronic component and an EMI shielding fence, wherein the electronic component is mounted on the substrate, the semiconductor package includes a plurality of conductive wires which are configured to construct the EMI shielding fence, the EMI shielding fence is located between the semiconductor component and the electronic component.

3. The semiconductor package in accordance with claim 1, wherein, an area of the exposed surface of the ball end is greater than a sectional area of the wire body, and the EMI shielding layer is connected to the exposed surface.

4. The semiconductor package in accordance with claim 1, wherein a ratio of an outer diameter of the wire body to an outer diameter of the ball end is greater than or equal to 1:1.1 and is less than or equal to 1:3.

5. A method of manufacturing semiconductor package comprising the steps of:
providing a carrier including a plurality of substrates connected with each other, each of the plurality of substrates includes at least one ground pad;
providing a plurality of semiconductor components, each of the plurality semiconductor components is mounted on and electrically connected to one of the plurality of substrates;
performing a wire bonding process, at least one conductive wire is formed on each of the plurality of substrates, the at least one conductive wire includes a wire body, a conduction end located on one side of the wire body and a ball end located on the other side of the wire body, an outer diameter of the ball end is greater than an outer diameter of the wire body, the wire body is extended upwardly from the substrate, the conduction end is configured to be bonded to the at least one ground pad of each of the plurality of substrates, and the ball end is configured to be located above each of the plurality of substrates;
performing a molding process, a plurality of molding materials are provided on the carrier, each of the plurality of molding materials is configured to cover one of the plurality of semiconductor components, the wire body and the conduction end of the at least one conductive wire;
performing a removing process to remove a part of each of the plurality of molding materials, wherein after the removing process, a notch is formed on each of the plurality of molding materials, the ball end is visible from the notch and has an exposed surface, the exposed surface is visible from an inner surface of the notch and is coplanar to the inner surface of the notch; and
forming an EMI shielding layer on each of the plurality of molding materials, the EMI shielding layer is configured to be connected to the ball end of the at least one conductive wire.

6. The method in accordance with claim 5 further comprising a step of providing a plurality of electronic components, wherein each of the plurality of electronic components is mounted on one of the plurality of substrates, a plurality of conductive wires are formed on each of the plurality of substrates in the wire bonding process, the plurality of conductive wires are configured to construct an EMI shielding fence located between the semiconductor component and the electronic component on the same substrate.

7. The method in accordance with claim 5, wherein the EMI shielding layer is configured to connect to the exposed surface of the ball end, and an area of the exposed surface of the ball end is greater than a sectional area of the wire body.

8. The method in accordance with claim 5, wherein a ratio of an outer diameter of the wire body to an outer diameter of the ball end is greater than or equal to 1:1.1 and is less than or equal to 1:3.

\* \* \* \* \*